United States Patent
Kang et al.

(10) Patent No.: US 9,496,192 B2
(45) Date of Patent: Nov. 15, 2016

(54) TEST PATTERN OF SEMICONDUCTOR DEVICE

(71) Applicant: Samsung Electronics Co., Ltd., Suwon-si (KR)

(72) Inventors: Dae-Lim Kang, Hwaseong-si (KR); Min-Ho Kwon, Bucheon-si (KR); Wei-Hua Hsu, Seongnam-si (KR); Sang-Hyun Woo, Seongnam-si (KR); Hwa-Sung Rhee, Seongnam-si (KR); Jun-Suk Choi, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 145 days.

(21) Appl. No.: 14/326,471

(22) Filed: Jul. 9, 2014

(65) Prior Publication Data

US 2015/0162331 A1  Jun. 11, 2015

(30) Foreign Application Priority Data

Dec. 9, 2013 (KR) .................. 10-2013-0152414

(51) Int. Cl.
*H01L 27/088* (2006.01)
*H01L 21/66* (2006.01)

(52) U.S. Cl.
CPC .......... *H01L 22/34* (2013.01); *H01L 27/0886* (2013.01)

(58) Field of Classification Search
CPC ... H01L 22/30; H01L 22/34; H01L 27/0886; H01L 29/66545; H01L 29/6681; H01L 21/823431; H01L 21/823821; H01L 21/845; H01L 29/41791; H01L 29/785; H01L 2029/7858; H01L 2924/13067; H01L 27/1211
See application file for complete search history.

(56) References Cited

U.S. PATENT DOCUMENTS

| | | | |
|---|---|---|---|
| 2003/0030075 A1 | 2/2003 | Yamaguchi et al. | |
| 2006/0163571 A1 | 7/2006 | Lim et al. | |
| 2008/0157800 A1 | 7/2008 | Hong | |
| 2011/0246121 A1 | 10/2011 | Bairo | |
| 2013/0193525 A1* | 8/2013 | Weis | H03K 17/063 257/379 |

FOREIGN PATENT DOCUMENTS

| | | |
|---|---|---|
| JP | 10-189679 | 7/1998 |
| JP | 2002-110944 | 4/2002 |
| JP | 2012-069601 | 4/2012 |
| KR | 10-2002-0056291 | 7/2002 |
| KR | 10-2006-0033122 | 4/2006 |
| KR | 10-0913328 | 9/2009 |

* cited by examiner

*Primary Examiner* — Benjamin Sandvik
*Assistant Examiner* — Leslie Pilar Cruz
(74) *Attorney, Agent, or Firm* — Muir Patent Law, PLLC

(57) ABSTRACT

A test pattern of a semiconductor device is provided, which includes first and second fins formed to project from a substrate and arranged to be spaced apart from each other, first and second gate structures formed to cross the first and second fins, respectively, a first source region and a first drain region arranged on the first fin on one side and the other side of the first gate structure, a second source region and a second drain region arranged on the second fin on one side and the other side of the second gate structure, a first conductive pattern connected to the first and second drain regions to apply a first voltage to the first and second drain regions and a second conductive pattern connecting the first source region and the second gate structure to each other.

17 Claims, 16 Drawing Sheets

TEST PATTERN OF SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0152414, filed on Dec. 9, 2013 in the Korean Intellectual Property Office (KIPO), the contents of which are herein incorporated by reference in their entirety.

BACKGROUND

1. Field

The present disclosure relates to a test pattern of a semiconductor device.

2. Description of the Related Art

In order for a semiconductor device to operate normally, alignment, isolation, or electrical connection between constituent elements that constitute the semiconductor device should satisfy their requirements. Further, since design rule reduction and multilayer wiring structures are typically used for high integration of the semiconductor device, the alignment, isolation, or electrical connection between the respective constituent elements as described above become important factors that directly exert an influence on the yield of the semiconductor device. Accordingly, various tests for testing whether the respective constituent elements are formed and operated as they are designed are performed when or before several steps of a process for fabricating a semiconductor device are performed.

As one of scaling techniques to heighten the density of a semiconductor device, a multi-gate transistor has been proposed, in which a fin-shaped or nanowire-shaped silicon body is formed on a substrate and a gate is formed on a surface of the silicon body.

Since such a multi-gate transistor uses a three-dimensional (3D) channel, it is easy to perform scaling. Further, current control capability can be improved even without increasing a gate length of the multi-gate transistor. In addition, a short channel effect (SCE) that an electric potential of a channel region is affected by a drain voltage can be effectively suppressed.

SUMMARY

In one embodiment, a test pattern is provided, which can accurately detect an electrical inferiority of a multi-gate transistor that uses a 3D channel.

Additional advantages, subjects, and features will be set forth in part in the description which follows and in part will become apparent to those having ordinary skill in the art upon examination of the following or may be learned from practice of the disclosed embodiments.

In one aspect of the present inventive concept, a test pattern of a semiconductor device includes first and second fins protruding from a substrate and being spaced apart from each other, first and second gate structures crossing over the first and second fins, respectively, a first source region and a first drain region on the first fin on one side and the other side of the first gate structure, respectively, a second source region and a second drain region on the second fin on one side and the other side of the second gate structure, respectively, a first conductive pattern connected to the first and second drain regions to apply a first voltage to the first and second drain regions, and a second conductive pattern connecting the first source region and the second gate structure.

In another aspect of the present inventive concept, a test pattern of a semiconductor device includes a plurality of fin-type transistors including fins protruding from a substrate and gate electrodes crossing over the fins, respectively, a first conductive pattern positioned to apply a first voltage to respective drain regions of the plurality of fin-type transistors, and a second conductive pattern electrically connecting a gate electrode of one transistor and a source region of another transistor.

In another aspect of the present inventive concept, a test pattern of a semiconductor device includes a first through Nth fin-type transistors including a first through Nth fins protruding from a substrate, respectively, wherein the first fin-type transistor includes a first gate structure crossing over the first fin, a first source region on the first fin on one side of the first gate structure, and a first drain region on the first fin on the other side of the first gate structure, the second fin-type transistor includes a second gate structure crossing over the second fin, a second source region on the second fin on one side of the second gate structure, and a second drain region on the second fin on the other side of the second gate structure, the (N−1)th fin-type transistor includes a (N−1)th gate structure crossing over the (N−1)th fin, a (N−1)th source region on the (N−1)th fin on one side of the (N−1)th gate structure, and a (N−1)th drain region on the (N−1)th fin on the other side of the (N−1)th gate structure, and the Nth fin-type transistor includes an Nth gate structure crossing over the Nth fin, an Nth source region on the Nth fin on one side of the Nth gate structure, and an Nth drain region on the Nth fin on the other side of the Nth gate structure, a first conductive pattern connected to the first through Nth drain regions, a second conductive pattern connected to the first gate structure, a third conductive pattern connecting the first source region and the second gate structure, a fourth conductive pattern connecting the (N−1)th source region and the Nth gate electrode, and a fifth conductive pattern connected to the Nth source region.

In some embodiments, the test pattern may further include a dummy gate structure between the first gate structure and the second gate structure.

In some embodiments, the dummy gate structure is substantially parallel to the first gate structure and the second gate structure.

In some embodiments, the test pattern may further include a dummy gate structure between the (N−1)th gate structure and the Nth gate structure.

In some embodiments, the dummy gate structure is substantially parallel to the (N−1)th gate structure and the Nth gate structure.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

Figure 1:
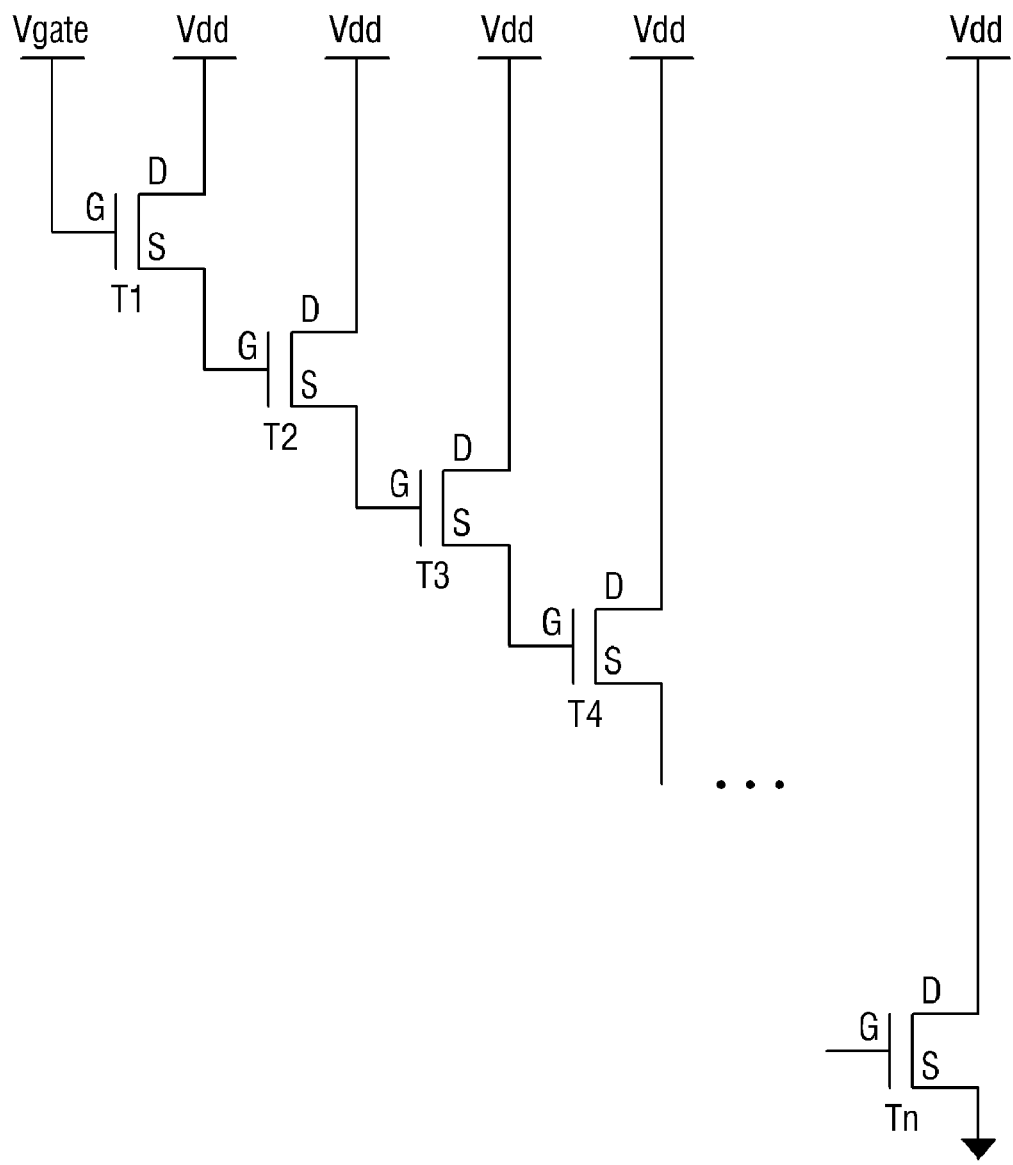
FIG. 1 is a circuit diagram of a test pattern of a semiconductor device according to an embodiment of the present inventive concept.

Advantages and features of the disclosed embodiments and methods of accomplishing the same may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as "contacting" another element, or being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a test pattern of a semiconductor device according to an embodiment of the present inventive concept will be described with reference to FIGS. 1 and 2.

Figure 2:
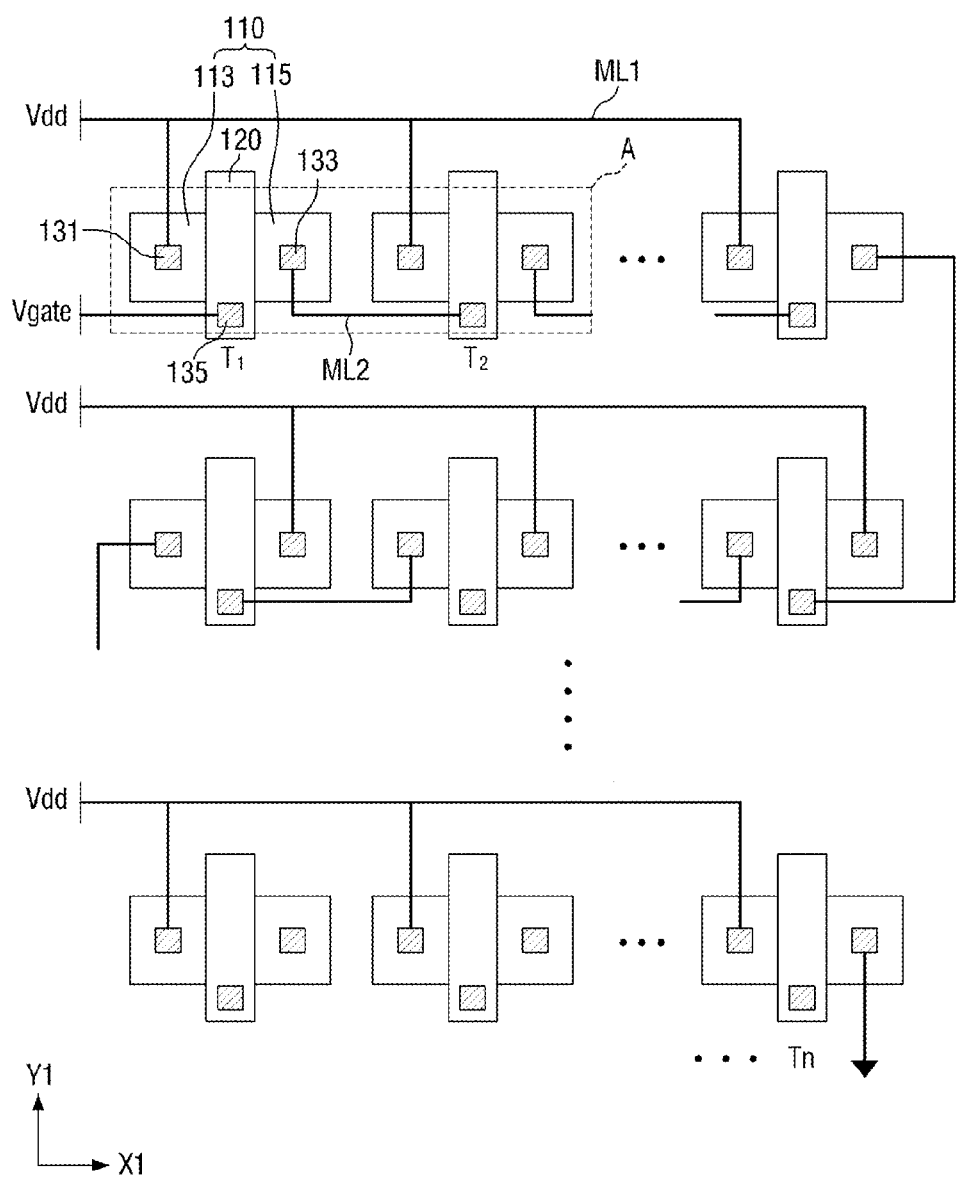
FIG. 2 is a layout diagram illustrating a test pattern of a semiconductor device according to an embodiment of the present inventive concept.

FIG. 1 is a circuit diagram of a test pattern of a semiconductor device according to an embodiment of the present inventive concept, and FIG. 2 is a layout diagram illustrating a test pattern of a semiconductor device according to an embodiment of the present inventive concept.

Referring to FIGS. 1 and 2, a plurality of fin-type transistors T1 to Tn are arranged. The plurality of fin-type transistors T1 to Tn are formed to be spaced apart from each other. The plurality of fin-type transistors t1 to Tn may be, for example, NMOS transistors or PMOS transistors. Each of the plurality of fin-type transistors T1 to Tn may include an active region 110 and a gate structure 120.

A test pattern of a semiconductor device according to an embodiment of the present inventive concept may be in a fin shape in which the active region 110 projects from a substrate. This feature will be described later.

The active region 110 may include a drain region 113 and a source region 115. The drain region 113 and the source region 115 may be separated by the gate structure 120 that is formed to cross the active region 110. Specifically, the drain region 113 may be formed on one side of the gate structure 120, and the source region 115 may be formed on the other side thereof.

A first voltage Vdd may be applied to the drain regions 113 of the plurality of fin-type transistors T1 to Tn. In order to apply the first voltage Vdd, the drain regions 113 included in the plurality of fin-type transistors T1 to Tn may be electrically connected to a first conductive pattern ML1. A first contact 131 may be formed on the drain region 113, and may connect the first conductive pattern ML1 and the drain region 113 to each other. Thus, the first conductive pattern ML1 is positioned to receive a first voltage Vdd and apply the voltage to the drain regions 113.

A second conductive pattern ML2 may electrically connect the gate structure 120 and the source region 115 to each other. For example, the gate structure 120 that is included in one of the plurality of fin-type transistors T1 to Tn may be electrically connected to the source region 115 that is included in another fin-type transistor. Specifically, the source region 115 of the first fin-type transistor T1 may be connected to the gate structure 120 of the second fin-type transistor T2 by the second conductive pattern ML2. Further, the source region 115 of the second fin-type transistor T2 may be connected to the gate structure 120 of the third fin-type transistor T3 by the second conductive pattern ML2. In this method, the gate structures 120 and the source regions 115 of the first to n-th (n is a natural number) fin-type transistors T1 to Tn may be respectively connected to each other by the second conductive pattern ML2.

A second contact 133 may be formed on the source region 115, and may connect the source region 115 and the second conductive pattern ML2 to each other. A third contact 135 may be formed on the gate structure 120, and may connect the gate structure 120 and the second conductive pattern ML2 to each other.

A second voltage Vgate may be applied to the first fin-type transistor T1 among the plurality of fin-type transistors T1 to Tn. Further, a third voltage, for example, a ground voltage, may be applied to the last fin-type transistor Tn among the plurality of fin-type transistors T1 to Tn that are sequentially connected to one another. Thus, the first fin-type transistor T1 may be positioned to receive a second voltage Vgate, and the last fin-type transistor Tn may be positioned to receive a third voltage.

If the first voltage Vdd is applied to the drain regions 113 of the plurality of fin-type transistors T1 to Tn and the second voltage Vgate is applied to the first fin-type transistor T1, current may flow between the drain region 113 and the source region 115 of the first fin-type transistor T1. As a result, the voltage is also applied to the source region 115 and then to the gate structure 120 of the second fin-type transistor T2, and thus current may flow between the drain region 113 and the source region 115 of the second fin-type transistor T2. In this manner, current may flow between the drain regions 113 and the source regions 115 of the plurality of fin-type transistors T1 to Tn. In this case, by measuring the current that flows to the drain regions 113 of the plurality of fin-type transistors T1 to Tn, it can be known whether the respective fin-type transistors T1 to Tn are inferior. For example, if current flows to the drain region 113, it can be known that the fin-type transistor that includes the drain region 113 is turned on and is normally operated. If no current flows to the drain region 113, it can be known that the fin-type transistor that includes the drain region 113 is turned off and thus is inferior. Further, by measuring the amount of current that flows to the drain region 113, it can be confirmed whether any other fin-type transistor interferes with the fin-type transistor or the fin-type transistor is properly formed.

Referring to FIGS. 3 to 6, the shape of a test pattern of a semiconductor device according to an embodiment of the present inventive concept will be described.

Figure 3:
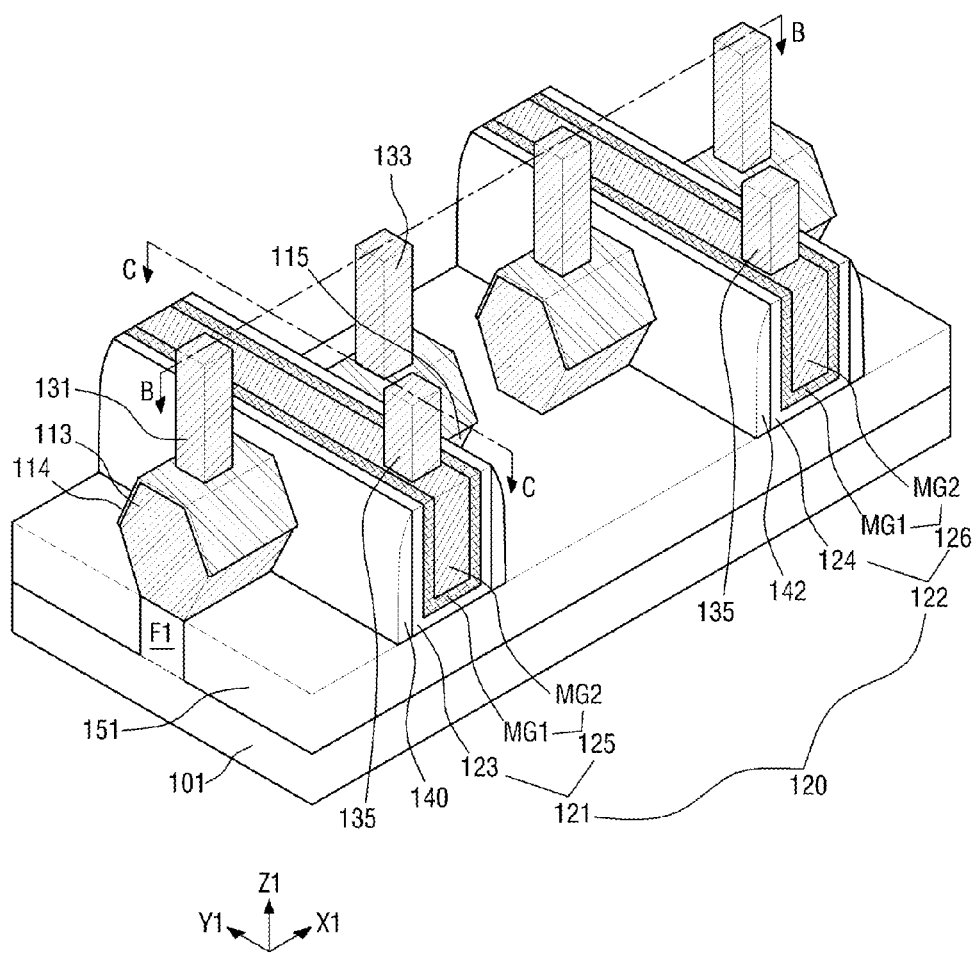
FIGS. 3 to 6 are views of portion A in FIG. 2 according to one embodiment.
Figure 4:
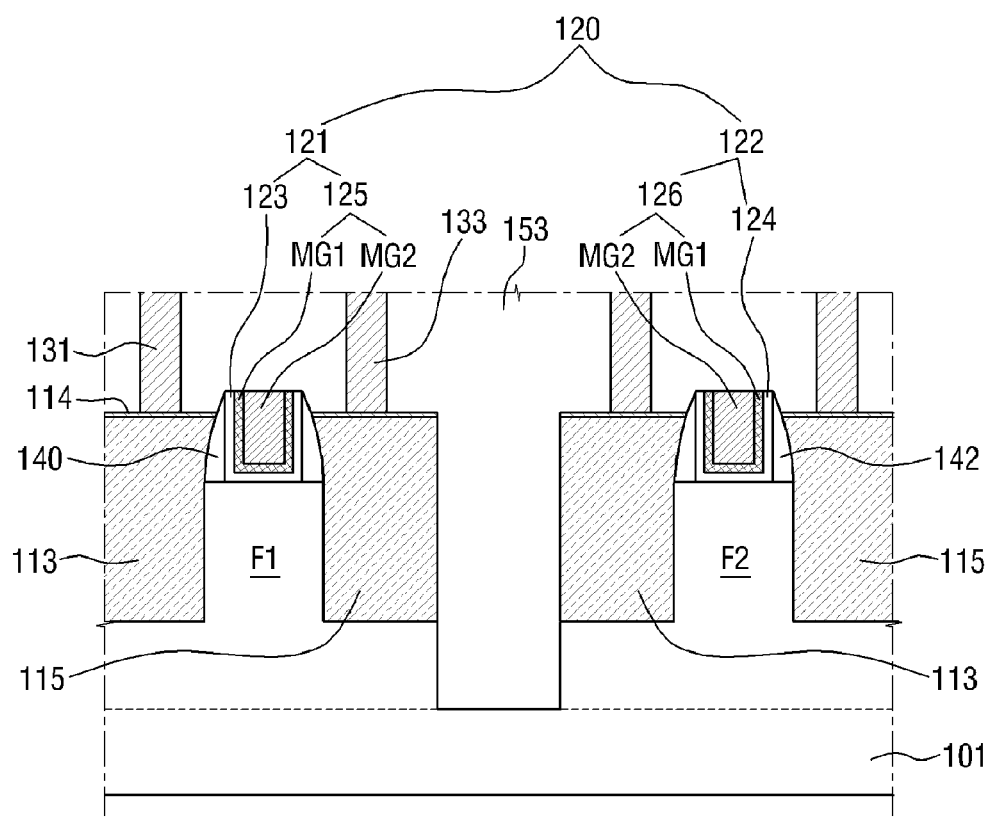
Figure 5:
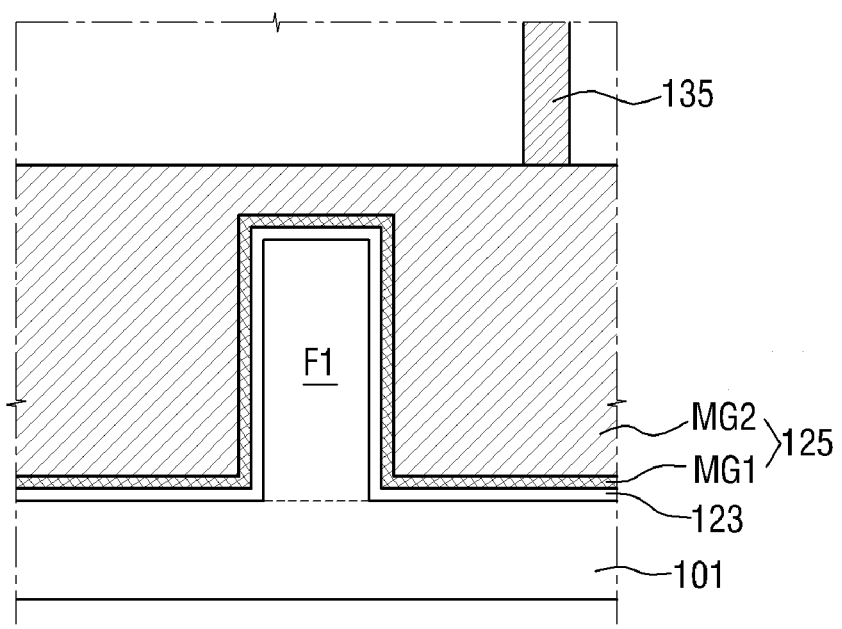
Figure 6:
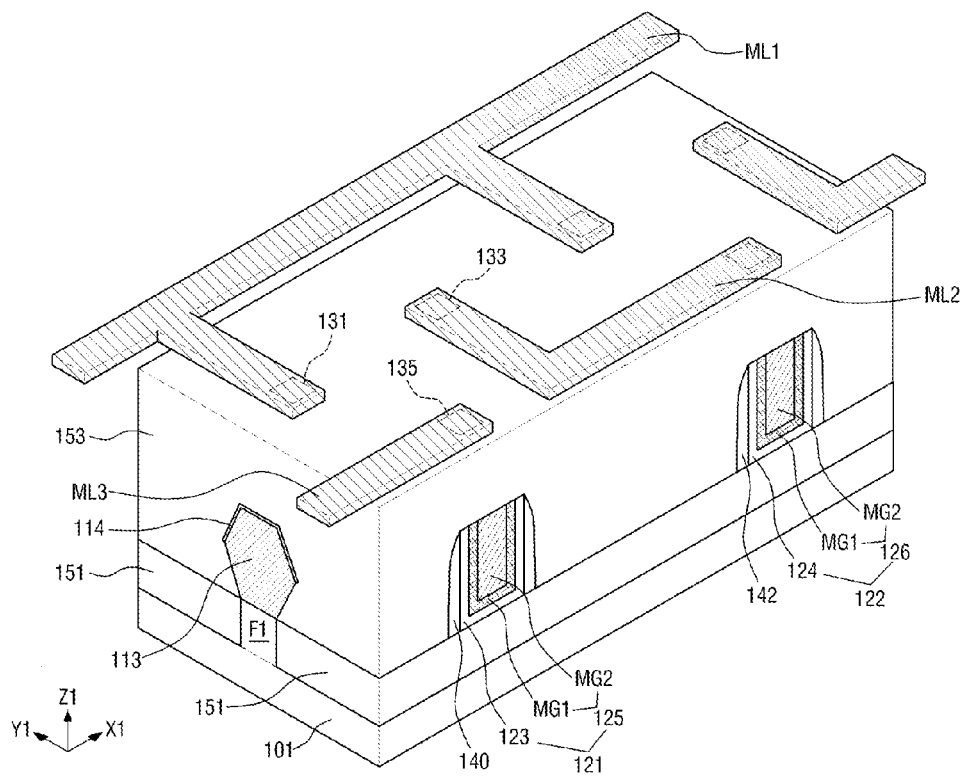

FIGS. 3 to 6 are views of portion A in FIG. 2 according to an embodiment. Specifically, FIGS. 3 and 6 are perspective views of portion A in FIG. 2, FIG. 4 is a cross-sectional view taken along line B-B of FIG. 3, and FIG. 5 is a cross-sectional view taken along line C-C of FIG. 3. In FIG. 3, for convenience in explanation, an interlayer insulating layer 153 and conductive patterns ML1, ML2, and ML3 are not illustrated.

Referring to FIGS. 3 to 6, a test pattern of a semiconductor device according to an embodiment of the present inventive concept includes a substrate 101, first and second fins F1 and F2, a gate structure 120, a source region 113, a drain region 115, and first to third contacts 131, 133, and 135.

The substrate 101 may be made of one or more semiconductor materials selected, for example, from the group of Si, Ge, SiGe, GaP, GaAs, SiC, SiGeC, InAs, and InP. Further, an SOI (Silicon On Insulator) substrate may be used.

The first and second fins F1 and F2 may be formed on the substrate 101, and may be formed to project from the substrate 101, for example, in a third direction Z1. The first and second fins F1 and F2 may be arranged to be spaced apart from each other on the substrate 101.

FIGS. 3 to 6 illustrate that the first and second fins F1 and F2 are aligned to extend lengthwise in a first direction X1, but the present inventive concept is not limited thereto. The first and second fins F1 and F2 may be aligned to extend lengthwise in a second direction Y1.

In the drawing, it is exemplarily illustrated that the first and second fins F1 and F2 are formed in a cuboidal shape, but they are not limited thereto. For example, the first and second fins F1 and F2 may be in a chamfered shape, or corner portions of the first and second fins F1 and F2 may be rounded. Since the first and second fins F1 and F2 are formed to extend long along the first direction X1, they may include a long side that is formed along the first direction X1 and a short side that is formed along the second direction Y1. Even if the corner portions of the first and second fins F1 and F2 are rounded, it will be apparent to those skilled in the art to which the present inventive concept pertains can discriminate between the long side and the short side.

In the drawing, it is illustrated that the first and second fins F1 and F2 are formed to be spaced apart from each other in the first direction X1, but they are not limited thereto. For example, if the first and second fins F1 and F2 are formed to extend lengthwise along the second direction Y1, they may be formed to be spaced apart from each other in the second direction Y1.

In certain embodiments, the first and second fins F1 and F2 may be integrally formed with the substrate 101, and may include the same material as the substrate 101.

An insulating layer 151 may be formed to cover side walls of the first and second fins F1 and F2.

The gate structure 120 may include, for example, a first gate structure 121 and a second gate structure 122. The first gate structure 121 may be formed on the first fin F1, and the second gate structure 122 may be formed on the second fin F2. Specifically, the first gate structure 121 may be formed to cross the first fin F1 in the second direction Y1, and the second gate structure 122 may be formed to cross the second fin F2 in the second direction Y1. As shown in FIG. 5, the first gate structure 121 may cover the side wall and an upper surface of the first fin F1, and the second gate structure 122 may cover the side wall and an upper surface of the second fin F2.

The first and second gate structures 121 and 122 may respectively include first and second gate insulating layers 123 and 124 and first and second gate electrodes 125 and 126.

The first and second gate electrodes 125 and 126 may include metal layers MG1 and MG2. As illustrated, in the first and second gate electrodes 125 and 126, two or more metal layers MG1 and MG2 may be stacked. The first metal layer MG1 serves to adjust a work function, and the second metal layer MG2 serves to fill a space that is formed by the first metal layer MG1. For example, the first metal layer MG1 may include at least one of TiN, TaN, TiC, and TaC. Further, the second metal layer MG2 may include W or Al. The first and second gate electrodes 125 and 126 may be made of Si, SiGe, or poly silicon, which is not a metal. The first and second metal layer MG1 and MG2 may be formed, for example, through a replacement process, but they are not limited thereto.

The first and second gate insulating layers 123 and 124 may be arranged between the first fin F1 and the first gate electrode 125, and between the second fin F2 and the second gate electrode 126. As illustrated in FIGS. 4 and 5, the first gate insulating layer 123 may be formed along the upper surface and an upper portion of the side surface of the first fin F1, and the second gate insulating layer 124 may be formed along the upper and an upper portion of the side surface of the second fin F2. The first and second gate insulating layers 123 and 124 may include a high-k material having higher dielectric constant than that of a silicon oxide layer. For example, the first and second gate insulating layers 123 and 124 may include $HFO_2$, $ZrO_2$, or $Ta_2O_5$.

A first spacer 140 may be arranged on the side wall of the first gate structure 121, and a second spacer 142 may be arranged on the side wall of the second gate structure 122.

A drain region 113 is arranged on one side of the first and second gate structures 121 and 122, and a source region 115 is arranged on the other side thereof. The drain region 113 and the source region 115 may be spaced apart from each other by the gate structure 120. The drain region 113 and the source region 115 may be formed, for example, through an epitaxial growth. The drain region 113 and the source region 115 may be in an elevated shape in which the drain region 113 and the source region 115 are formed to project above the first and second fins F1 and F2.

The source region 113 and the drain region 115 may be in various shapes. For example, the source region 113 and the drain region 115 may have at least one of a diamond shape, a circular shape, a pentagonal shape, and a rectangular shape. In the drawing, a hexagonal shape is exemplarily illustrated.

If the drain region 113 and the source region 115 are the drain region and the source region of a PMOS transistor, they may include a compression stress material. For example, the compression stress material may be a material having higher lattice constant than Si, and may be, for example, SiGe. The compression stress material can improve mobility of carriers (holes) in a channel region through applying compression stress to the first and second fins F1 and F2.

Unlike this, if the drain region 113 and the source region 115 are the drain region and the source region of an NMOS transistor, they may include the same material as the substrate 101 or a tension stress material. For example, if the substrate 101 includes Si, the drain region 113 and the source region 115 may include Si or a material having lower lattice constant than Si (e.g., SiC). The tension stress material can improve the mobility of carriers (electrons) in a channel region through applying tension stress to the first and second fins F1 and F2. The first contact 131 is arranged on the drain region 113, and the second contact 133 is formed on the source region 115. The third contact 135 is formed on the gate structure 120 to come in contact with the first and second gate electrodes 125 and 126. A first silicide layer 114 may be formed between the drain region 113 and the first contact 131 and between the source region 115 and the second contact 133. The first silicide layer 114 may cover the upper surface of the drain region 113 and may cover the upper surface of the source region 115. Further, the first silicide layer 114 may be formed on the lower surfaces of the first and second contacts 131 and 133. The first silicide layer 114 may serve to reduce the surface resistance and contact resistance of the drain region 113 and the source region 115.

The first silicide layer 114 may include a conductive material, for example, Pt, Ni, or Co.

The interlayer insulating layer 153 is formed on the substrate 101. The interlayer insulating layer 153 may cover the gate structure 120, the drain region 113, the source region 115, and the side walls of the first to third contacts 131, 133, and 135 except for the upper surfaces of the first to third contacts 131, 133, and 135.

Referring to FIG. 6, the first to third conductive patterns ML1, ML2, and ML3 may be arranged on the interlayer insulating layer 153.

The first conductive pattern ML1 may be connected to the first contact 133. Specifically, the first conductive pattern ML1 may be electrically connected to a first drain region that is the drain region 113 arranged on the first fin F1 and a second drain region that is the drain region 113 arranged on the second fin F2 through the first contact 131. The first conductive pattern ML1 may apply the first voltage Vdd to the drain region 113.

The second conductive pattern ML2 may be connected to the second and third contacts 133 and 135. Specifically, the second conductive pattern ML2 may be electrically connected to a first source region that is the source region 115 arranged on the first fin F1 and the second gate structure 122 through the second and third contacts 133 and 135.

The third conductive pattern ML3 may be connected to the third contact 135 that comes in contact with the first gate structure 121. The second voltage Vgate may be applied to the first gate structure 121 by the third conductive pattern ML3. The second voltage Vgate may differ from the first voltage Vdd.

Figure 7:
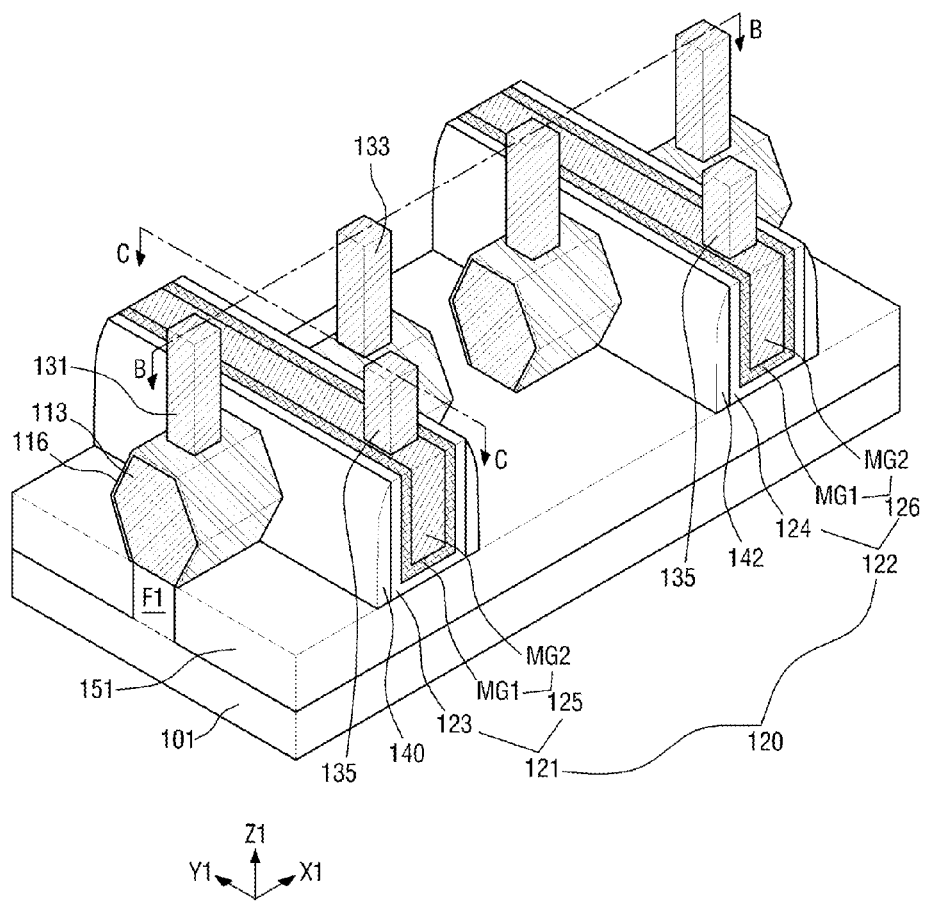
FIGS. 7 and 8 are views of portion A in FIG. 2 according to another embodiment of the present inventive concept.
Figure 8:
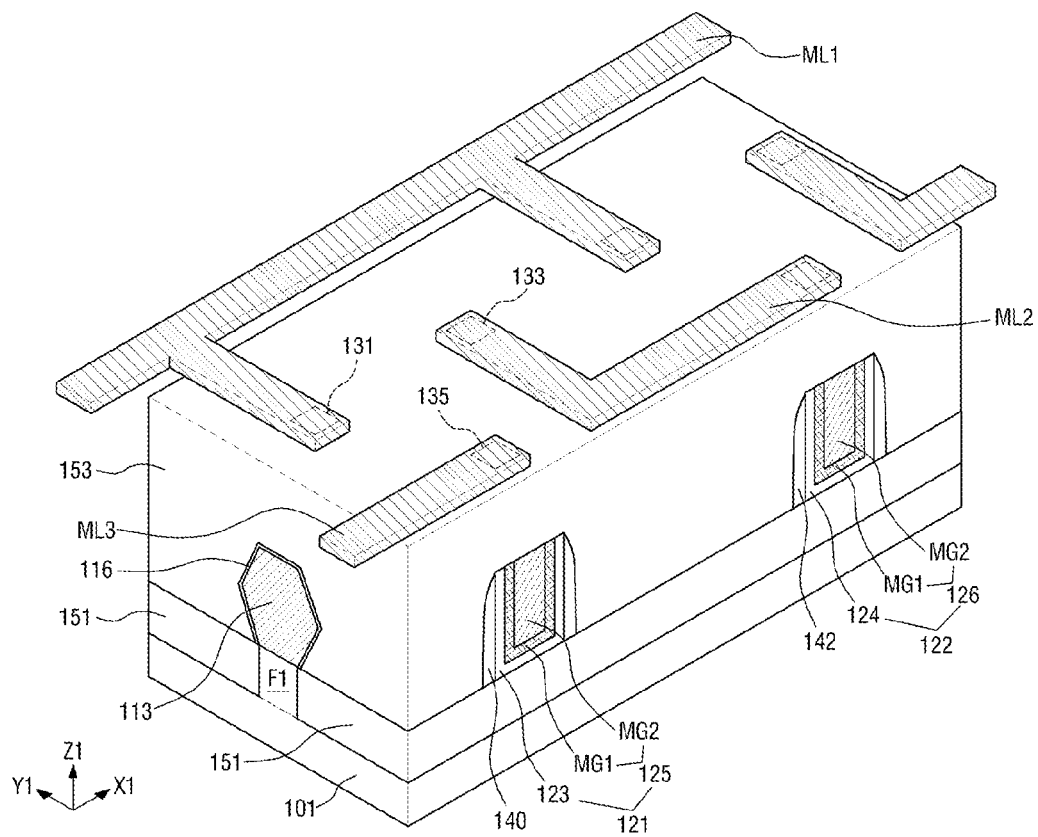

Referring to FIGS. 7 and 8, portion A in FIG. 2 according to another embodiment of the present inventive concept will be described. FIGS. 7 and 8 are views of portion A in FIG. 2 according to another embodiment of the present inventive concept. For convenience in explanation, FIG. 7 does not illustrate the interlayer insulating layer 153 and the conductive patterns ML1, ML2, and ML3. The contents duplicate to those as described above will be omitted, and explanation will be made around the different points between them.

Referring to FIGS. 7 and 8, the shapes of the silicide layers may differ from each other. Specifically, a second silicide layer 116 may be formed between the drain region 113 and the first contact 131 and between the source region 115 and the second contact 133. The second silicide layer 116 may cover the surface of the drain region 113 and the surface of the source region 115. In FIGS. 3 to 6, the first silicide layer 114 covers only the upper surfaces of the source region 115 and the drain region 113, and in FIGS. 7 and 8, the first silicide layer 114 may be formed to surround the drain region 113 and the source region 115. In the same manner as the first silicide layer 114, the second silicide layer 116 may serve to reduce the surface resistance and contact resistance of the drain region 113 and the source region 115.

The second silicide layer 116 may include a conductive material, for example, Pt, Ni, or Co.

Figure 9:
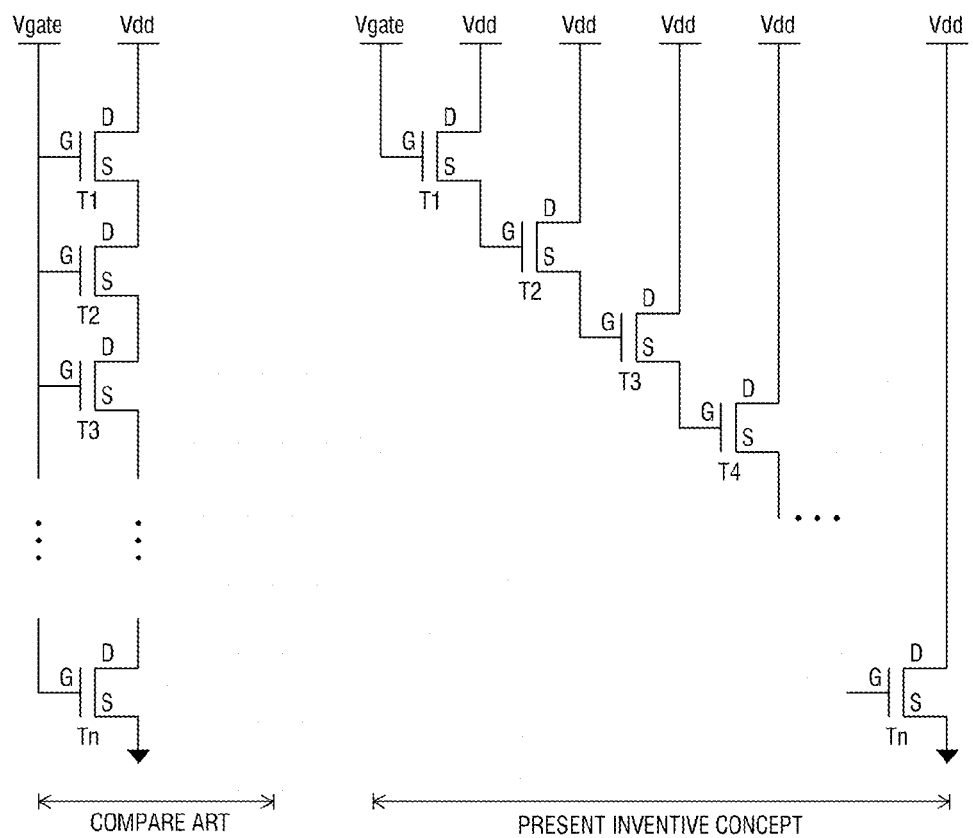
FIG. 9 is a circuit diagram explaining the effect of a test pattern of a semiconductor device according to an embodiment of the present inventive concept.

Referring to FIG. 9, the effect of a test pattern of a semiconductor device according to an embodiment of the present inventive concept will be described.

FIG. 9 is a circuit diagram explaining the effect of a test pattern of a semiconductor device according to an embodiment of the present inventive concept.

Referring to FIG. 9, in order to measure the device inferiority of the plurality of fin-type transistors T1 to Tn in the related art, the second voltage Vgate is applied to the gates G of the plurality of fin-type transistors T1 to Tn, and the plurality of fin-type transistors T1 to Tn are connected in series. Specifically, the source S of the first fin-type transistor T1 is connected to the drain D of the second fin-type transistor T2, and the source S of the second fin-type transistor T2 is connected to the drain D of the third transistor T3. The first voltage Vdd is applied to the drain D of the first fin-type transistor T1, and the third voltage, that is, the ground voltage, is applied to the n-th transistor Tn.

If the device inferiority is measured in the above-described circuit configuration in the related art, parasitic resistance is added to the plurality of fin-type transistors T1 to Tn due to the serial connection of the plurality of fin-type transistors T1 to Tn. Accordingly, as the number of connected transistors, that is, n, becomes larger, the added parasitic resistance becomes higher, and as going from the first fin-type transistor T1 to the n-th fin-type transistor Tn, the current that flows to the respective fin-type transistors is decreased, and thus it is unable to be accurately measured whether the respective fin-type transistors are inferior.

However, according to the test pattern of the semiconductor device according to an embodiment of the present inventive concept, since the plurality of fin-type transistors T1 to Tn are not connected in series, the parasitic resistance is not added thereto, and thus it can be accurately detected and/or confirmed whether the first to n-th fin-type transistors T1 to Tn are inferior.

Referring to FIGS. 1 to 10, a test pattern of a semiconductor device according to another embodiment of the present inventive concept will be described.

Figure 10:
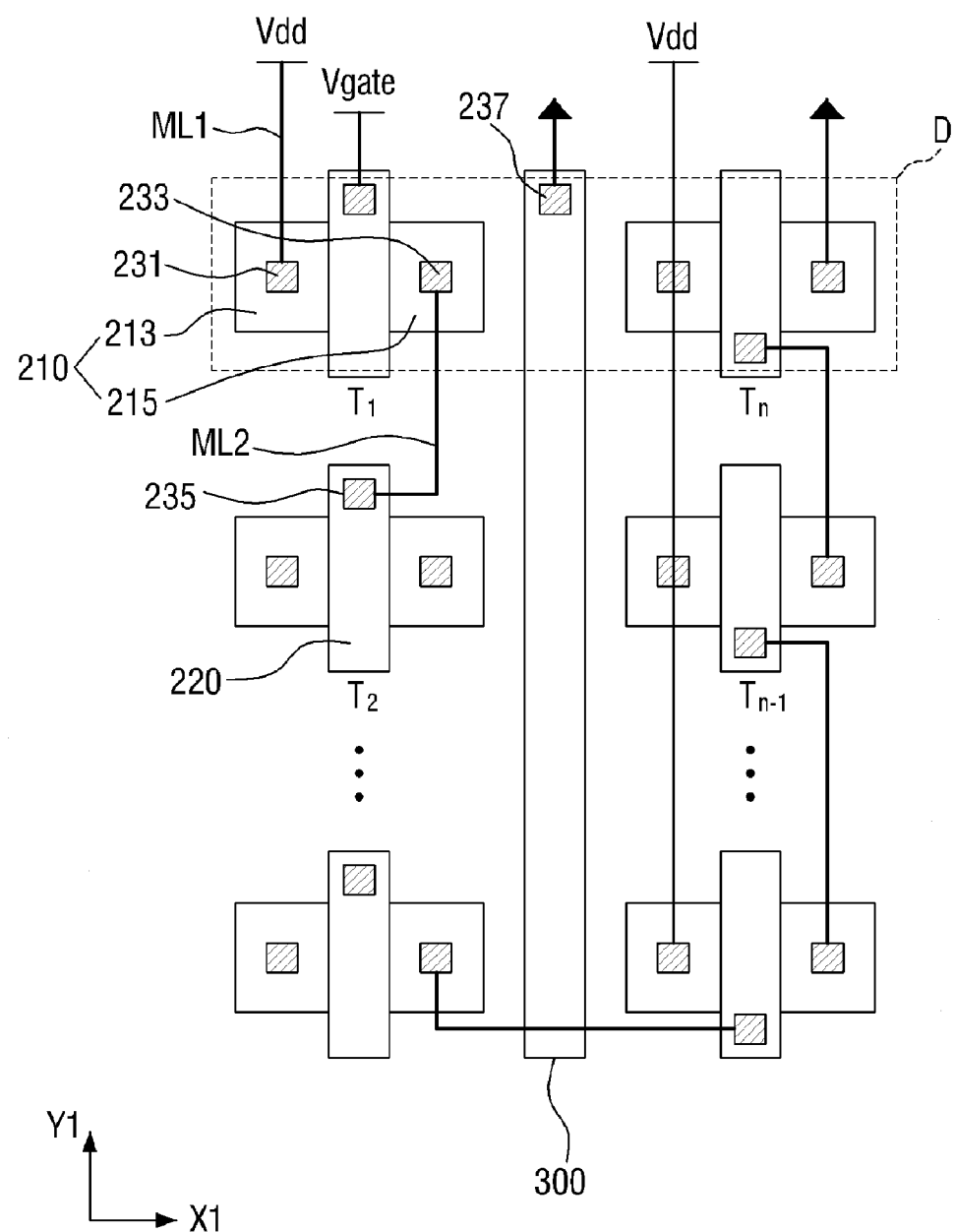
FIG. 10 is a layout diagram of a test pattern of a semiconductor device according to another embodiment of the present inventive concept.

FIG. 10 is a layout diagram of a test pattern of a semiconductor device according to another embodiment of the present inventive concept.

A test pattern of a semiconductor device according to another embodiment of the present inventive concept may have the same circuit diagram as the test pattern of the semiconductor device according to an embodiment such as described above. Accordingly, respective drains D of a plurality of fin-type transistors T1 to Tn may be connected to a first conductive pattern ML1 to receive a supply of a first voltage Vdd. Further, the gate G of one fin-type transistor among the plurality of fin-type transistors T1 to Tn may be connected to the source S of another fin-type transistor by a second conductive pattern ML2. Specifically, a source region 215 of the first fin-type transistor T1 may be electrically connected to a gate structure 220 of the second fin-type transistor T2. Then, the source region 215 of the second fin-type transistor T2 may be electrically connected to the gate structure 220 of the third fin-type transistor T3, and in the same manner, the first fin-type transistor T1 to the n-th fin-type transistor Tn can be electrically connected by the second conductive pattern ML2. The drain region 213 and the source region 215 may form an active region 210, and the active region 210 may have a fin shape. This feature will be described later.

A second voltage Vgate may be applied to the first fin-type transistor T1 among the plurality of fin-type transistors T1 to Tn that are sequentially connected to one another, and a third voltage, for example, a ground voltage, may be applied to the n-th fin-type transistor Tn that is the last fin-type transistor. A first contact 231 is arranged on the drain region 213 and may come in contact with the first conductive pattern ML1. A second contact 233 is arranged on the source region 215, and a third contact 235 is arranged on the gate structure 220. The second and third contacts 233 and 235 may come in contact with the second conductive pattern ML2.

The test pattern of the semiconductor device according to another embodiment of the present inventive concept may include a dummy gate structure 300. The dummy gate structure 300 does not serve as the actual gate structure 220.

The dummy gate structure 300 may be arranged between the plurality of fin-type transistors T1 to Tn. Specifically, as shown in FIG. 8, the dummy gate structure 300 may be arranged between the first transistor T1 and the n-th transistor Tn and between the second transistor T2 and the (n−1)-th transistor (Tn−1), and may extend long in the second direction Y1. In one embodiment, the dummy gate structure 300 is not connected to the first and second conductive patterns ML1 and ML2, and may receive a supply of the ground voltage through the fourth contact 237 that is arranged on the dummy gate structure 300.

According to the test pattern of the semiconductor device according to another embodiment of the present inventive concept, the first voltage Vdd is applied to the drain regions 213 of the plurality of fin-type transistors T1 to Tn, the ground voltage is applied to the dummy gate structure 300, and the second voltage Vgate is applied to the gate structure 220 of the first transistor T1. Thereafter, the current that flows to the drain regions 213 of the plurality of fin-type transistors T1 to Tn is measured to determine whether the plurality of fin-type transistors T1 to Tn are inferior. Further, the amount of current that flows to the drain regions 213 is measured to confirm whether the dummy gate structure 300 interferes with the operations of the plurality of fin-type transistors.

Referring to FIGS. 11 to 14, the shape of a test pattern of a semiconductor device according to another embodiment of the present inventive concept will be described.

Figure 11:
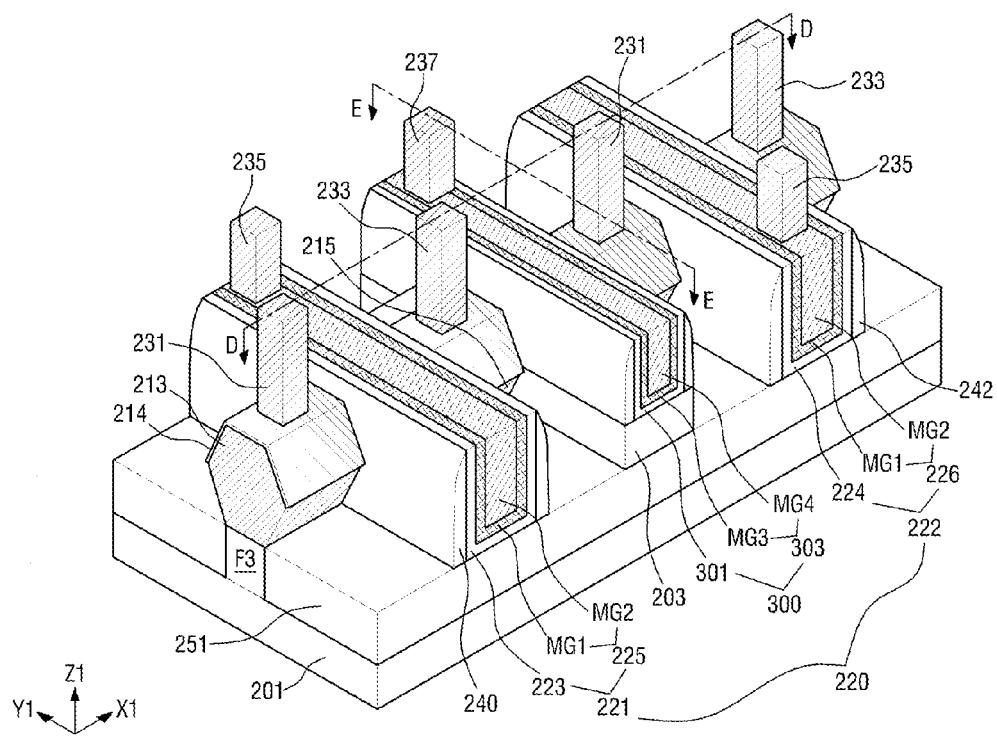
FIGS. 11 to 14 are exemplary views of portion D in FIG. 10.
Figure 12:
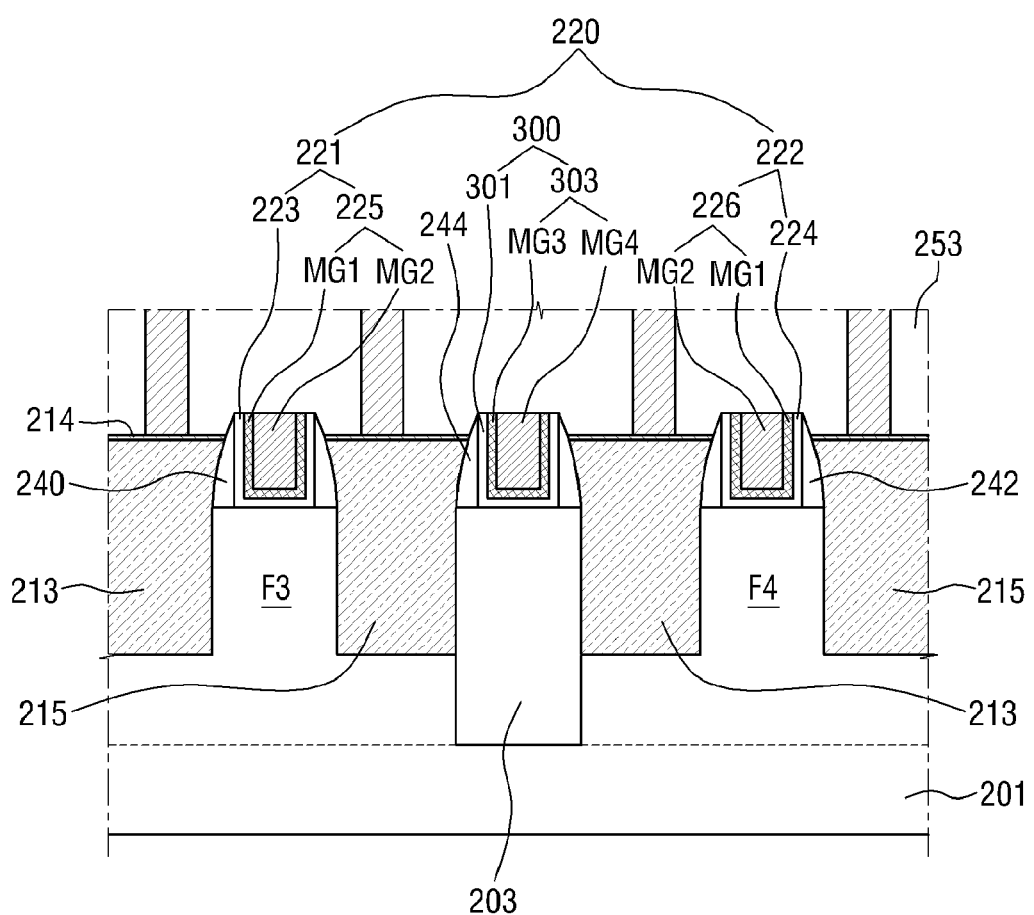
Figure 13:
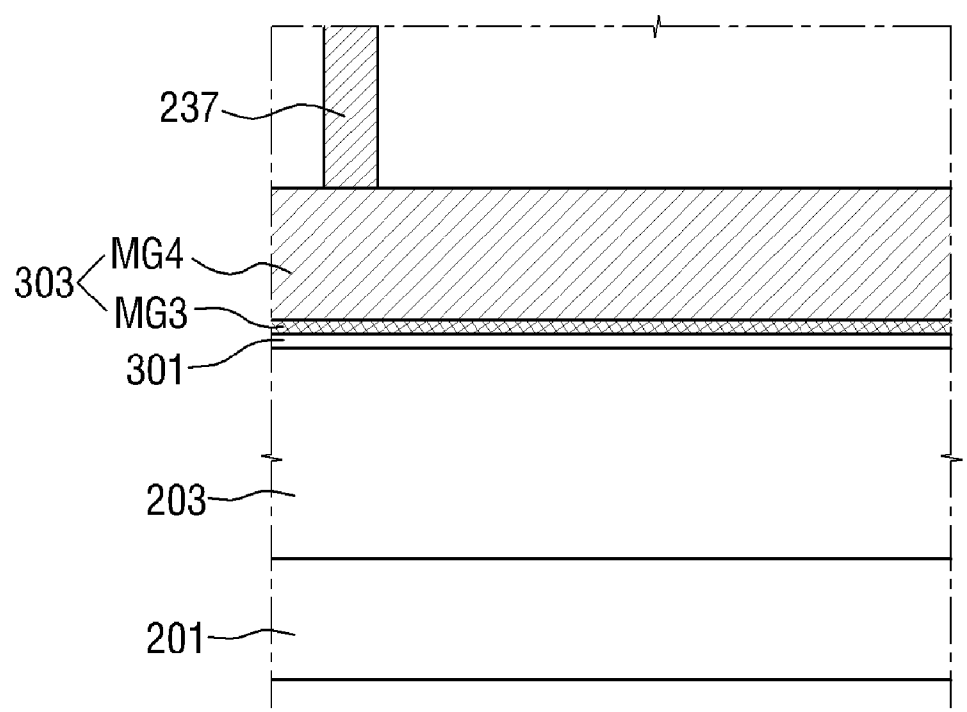
Figure 14:
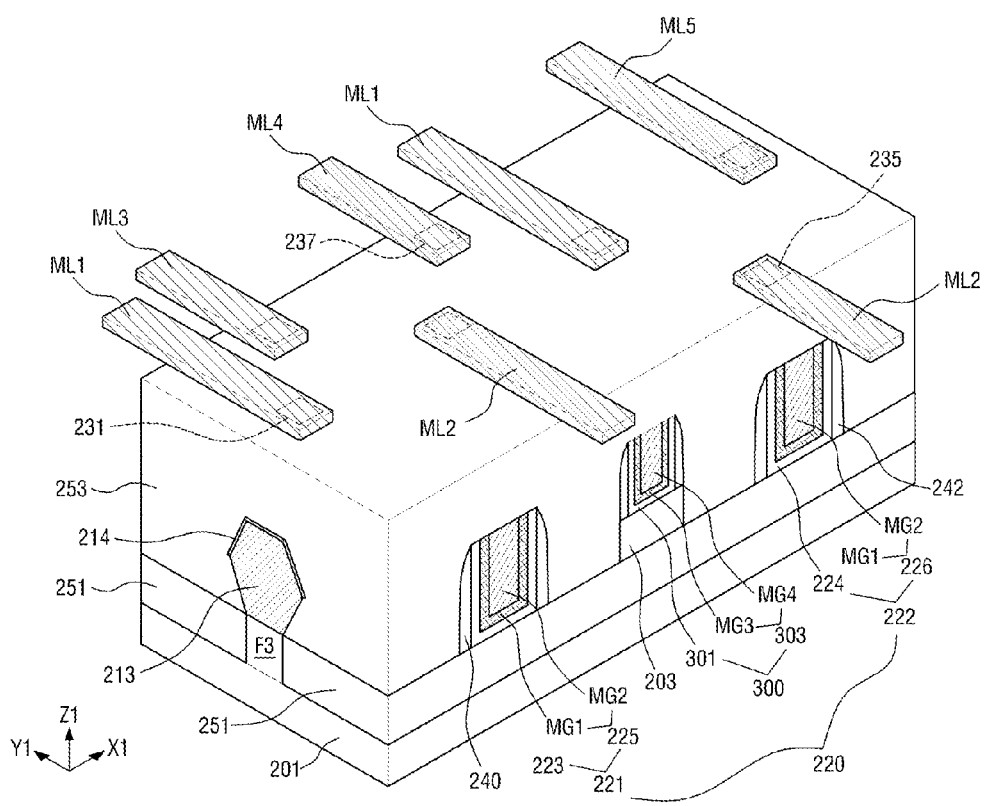

FIGS. 11 to 14 are views of portion D in FIG. 10. Specifically, FIGS. 11 and 14 are perspective views of portion D in FIG. 10, FIG. 12 is a cross-sectional view taken along line E-E of FIG. 11, and FIG. 13 is a cross-sectional view taken along line F-F of FIG. 11. In FIG. 11, for convenience in explanation, an interlayer insulating layer 253 and conductive patterns ML1, ML2, ML3, ML4, and ML5 are not illustrated.

Referring to FIGS. 11 to 14, a test pattern of a semiconductor device according to another embodiment of the present inventive concept may include a substrate 201, third and fourth fins F3 and F4, a gate structure 220, a source region 213, a drain region 215, first to fourth contacts 231, 233, 235, and 237, and first to fifth conductive patterns ML1, ML2, ML3, ML4, and ML5.

The substrate 201 may be made of one or more semiconductor materials selected, for example, from the group of Si, Ge, SiGe, GaP, GaAs, SiC, SiGeC, InAs, and InP. Further, an SOI (Silicon On Insulator) substrate may be used.

The third and fourth fins F3 and F4 may be formed on the substrate 201, and may be formed to project from the substrate 201, for example in a third direction Z1. The third and fourth fins F3 and F4 may be arranged to be spaced apart from each other on the substrate 201.

FIGS. 11 to 14 illustrate that the third and fourth fins F3 and F4 are aligned to extend lengthwise in the first direction X1, but the present inventive concept is not limited thereto. The third and fourth fins F3 and F4 may be aligned to extend lengthwise in the second direction Y1.

In the drawing, it is exemplarily illustrated that the third and fourth fins F3 and F4 are formed in a cuboidal shape, but they are not limited thereto. For example, the third and fourth fins F3 and F4 may be in a chamfered shape, or corner portions of the third and fourth fins F3 and F4 may be rounded. Since the third and fourth fins F3 and F4 are formed to extend long along the first direction X1, they may include a long side that is formed along the first direction X1 and a short side that is formed along the second direction Y1. Even if the corner portions of the third and fourth fins F3 and F4 are rounded, it will be apparent to those skilled in the art to which the present inventive concept pertains to discriminate between the long side and the short side.

In the drawing, it is illustrated that the third and fourth fins F3 and F4 are formed to be spaced apart from each other in the first direction X1, but they are not limited thereto. For example, if the third and fourth fins F3 and F4 are formed to extend lengthwise along the second direction Y1, they may be formed to be spaced apart from each other in the second direction Y1.

The third and fourth fins F3 and F4 may be integrally formed with the substrate 201, and may include the same material as the substrate 201.

An insulating layer 251 may be formed to cover side walls of the third and fourth fins F3 and F4.

The gate structure 220 may include a third gate structure 221 and a fourth gate structure 222. The third gate structure 221 may be formed on the third fin F3, and the fourth gate structure 222 may be formed on the fourth fin F4. Specifically, the third gate structure 221 may be formed to cross the third fin F3 in the second direction Y1, and the fourth gate structure 222 may be formed to cross the fourth fin F4 in the second direction Y1. The third gate structure 221 may cover the side wall and an upper surface of the third fin F3, and the fourth gate structure 222 may cover the side wall and an upper surface of the fourth fin F4.

The third and fourth gate structures 221 and 222 may respectively include third and fourth gate insulating layers 223 and 224 and third and fourth gate electrodes 225 and 226.

In one embodiment, the third and fourth gate electrodes 225 and 226 may include metal layers MG1 and MG2. As illustrated, in the third and fourth gate electrodes 225 and 226, two or more metal layers MG1 and MG2 may be stacked. The first metal layer MG1 serves to adjust a work function, and the second metal layer MG2 serves to fill a space that is formed by the first metal layer MG1. For example, the first metal layer MG1 may include at least one of TiN, TaN, TiC, and TaC. Further, the second metal layer MG2 may include W or Al. The third and fourth gate electrodes 225 and 226 may be made of Si, SiGe, or poly silicon, which is not a metal. The first and second metal layer MG1 and MG2 may be formed, for example, through a replacement process, but are not limited thereto.

The third and fourth gate insulating layers 223 and 224 may be arranged between the third fin F3 and the third gate electrode 225, and between the fourth fin F4 and the fourth gate electrode 226. The third gate insulating layer 223 may be formed along the upper surface and an upper portion of the side surface of the third fin F3, and the fourth gate insulating layer 224 may be formed along the upper surface and an upper portion of the side surface of the fourth fin F4. The third and fourth gate insulating layers 223 and 224 may include a high-k material having higher dielectric constant than that of a silicon oxide layer. For example, the third and fourth gate insulating layers 223 and 224 may include $HFO_2$, $ZrO_2$, or $Ta_2O_5$.

A third spacer 240 may be arranged on the side wall of the third gate structure 221, and a fourth spacer 242 may be arranged on the side wall of the fourth gate structure 222.

A drain region 213 is arranged on one side of the third and fourth gate structures 221 and 222, and a source region 215 is arranged on the other side thereof. The drain region 213 and the source region 215 may be spaced apart from each other by the gate structure 220. The drain region 213 and the source region 215 may be formed, for example, through an epitaxial growth. The drain region 213 and the source region 215 may be in an elevated shape in which the drain region 213 and the source region 215 are formed to project above the third and fourth fins F3 and F4.

The source region 213 and the drain region 215 may be in various shapes. For example, the source region 213 and the drain region 215 may have at least one of a diamond shape, a circular shape, a pentagonal shape, and a rectangular shape. In the drawing, a hexagonal shape is exemplarily illustrated.

If the drain region 213 and the source region 215 are the drain region and the source region of a PMOS transistor, they may include a compression stress material. For example, the compression stress material may be a material having higher lattice constant than Si, and may be, for example, SiGe. The compression stress material can improve mobility of carriers (holes) in a channel region through applying compression stress to the third and fourth fins F3 and F4.

Unlike this, if the drain region 213 and the source region 215 are the drain region and the source region of an NMOS transistor, they may include the same material as the substrate 201 or a tension stress material. For example, if the substrate 201 includes Si, the drain region 213 and the source region 215 may include Si or a material having lower lattice constant than Si (e.g., SiC). The tension stress material can improve the mobility of carriers (electrons) in a channel region through applying tension stress to the third and fourth fins F3 and F4.

In one embodiment, the dummy gate structure 300 is arranged between the third fin F3 and the fourth fin F4. In the same manner as the gate structure 220, the dummy gate structure 300 may extend in the second direction Y1.

The dummy gate structure 300 is formed on a field insulating layer 203 that fills between the third fin F3 and the fourth fin F4. Accordingly, the dummy gate structure 300 does not cross the fin. Since the dummy gate structure 300 is formed on the field insulating layer 203, it is not formed to be lower than the gate structure 220. Specifically, the lower surface of the dummy gate structure 300 may be equal to or higher than the lower surface of the third and fourth gate structures 221 and 222. FIGS. 9 and 10 illustrate that the lower surface of the dummy gate structure 300 has the same height as the lower surface of the third and fourth gate structures 221 and 222. However, the lower surface of the dummy gate structure 300 may be formed to be higher than the lower surface of each of the third and fourth gate structures 221 and 222.

The field insulating layer 203 may include the same material as the insulating layer 251. For example, the field insulating layer 203 may be an oxide layer.

The dummy gate structure 300 may include a dummy gate insulating layer 301 and a dummy gate electrode 303. As shown in FIG. 11, the dummy gate insulating layer 301 and the dummy gate electrode 303 may be sequentially stacked on the field insulating layer 203.

The dummy gate electrode 303 may include a third metal layer MG3 and a fourth metal layer MG4. As illustrated, in the dummy gate electrode 303, two or more metal layers MG3 and MG4 may be stacked. The third metal layer MG3 may include the same material as the first metal layer MG1, and the fourth metal layer MG4 may include the same material as the second metal layer MG2. Further, the dummy gate electrode 303 may be made of Si, SiGe, or poly silicon, which is not a metal. The third and fourth metal layer MG3 and MG4 may be formed, for example, through a replacement process, but are not limited thereto.

The dummy gate insulating layer 301 may be arranged between the field insulating layer 203 and the dummy gate electrode 303. In one embodiment, the dummy gate insulating layer 301 may include the same material as the first and fourth gate insulating layers 223 and 224.

A dummy spacer 244 is formed on a side wall of the dummy gate structure 300. Since the dummy spacer 244 and the dummy gate structure 300 covers the field insulating layer 203, the upper surface of the field insulating layer 203 is not exposed.

A first contact 231 is arranged on the drain region 213 to come in contact with the drain region 213, and a second contact 233 is formed on the source region 215. A third contact 235 is formed on the gate structure 220 to come in contact with the third and fourth gate electrodes 225 and 226. A fourth contact 237 is formed on the dummy gate structure 300 to come in contact with the dummy gate electrode 303.

A first silicide layer 214 may be formed between the drain region 213 and the first contact 231 and between the source region 215 and the second contact 233. The first silicide layer 214 may cover the upper surface of the drain region 213 and may cover the upper surface of the source region 215. Further, the first silicide layer 214 may be formed on the lower surfaces of the first and second contacts 231 and 233. The first silicide layer 214 may serve to reduce the surface resistance and contact resistance of the drain region 213 and the source region 215.

The first silicide layer 214 may include a conductive material, for example, Pt, Ni, or Co.

The interlayer insulating layer 253 is formed on the substrate 201. The interlayer insulating layer 253 may cover the gate structure 220, the dummy gate structure 300, the drain region 213, the source region 215, and the side walls of the first to fourth contacts 231, 233, 235, and 237 except for the upper surfaces of the first to fourth contacts 231, 233, 235, and 237.

Referring to FIG. 12, the first to fifth conductive patterns ML1, ML2, ML3, ML4, and ML5 may be arranged on the interlayer insulating layer 253.

The first conductive pattern ML1 may be connected to the first contact 233. Specifically, the first conductive pattern ML1 may be electrically connected to a third drain region that is the drain region 213 arranged on the third fin F3 and a second drain region that is the drain region 213 arranged on the fourth fin F4 through the first contact 231. The first conductive pattern ML1 may apply the first voltage Vdd to the drain region 213.

The second conductive pattern ML2 may be connected to the second and third contacts 233 and 235. Specifically, the second conductive pattern ML2 may be electrically connected to a third source region that is the source region 215 arranged on the third fin F3 and the fourth gate structure 222 through the second and third contacts 233 and 235.

The third conductive pattern ML3 may be connected to the third contact 235 that comes in contact with the third gate structure 221. The second voltage Vgate may be applied to the third gate structure 221 by the third conductive pattern ML3. The second voltage Vgate may differ from the first voltage Vdd.

The fourth conductive pattern ML4 may be connected to the fourth contact 237 that comes in contact with the dummy gate structure 300. The third voltage, for example, ground voltage, may be applied to the dummy gate structure 300 by the fourth conductive pattern ML4.

The fifth conductive pattern ML5 may be connected to the fourth source region that is the source region 215 arranged on the fourth fin F4 by the second contact 233. The third voltage, for example, ground voltage, may be applied to the fourth source region by the fifth conductive pattern ML5.

FIG. 12 illustrates that the first to fifth conductive patterns ML1, ML2, ML3, ML4, and ML5 extend in the second direction Y1. However, the present inventive concept is not limited thereto, and the conductive patterns may extend in another direction depending on the arrangement shape of the fin and the transistor.

Figure 15:
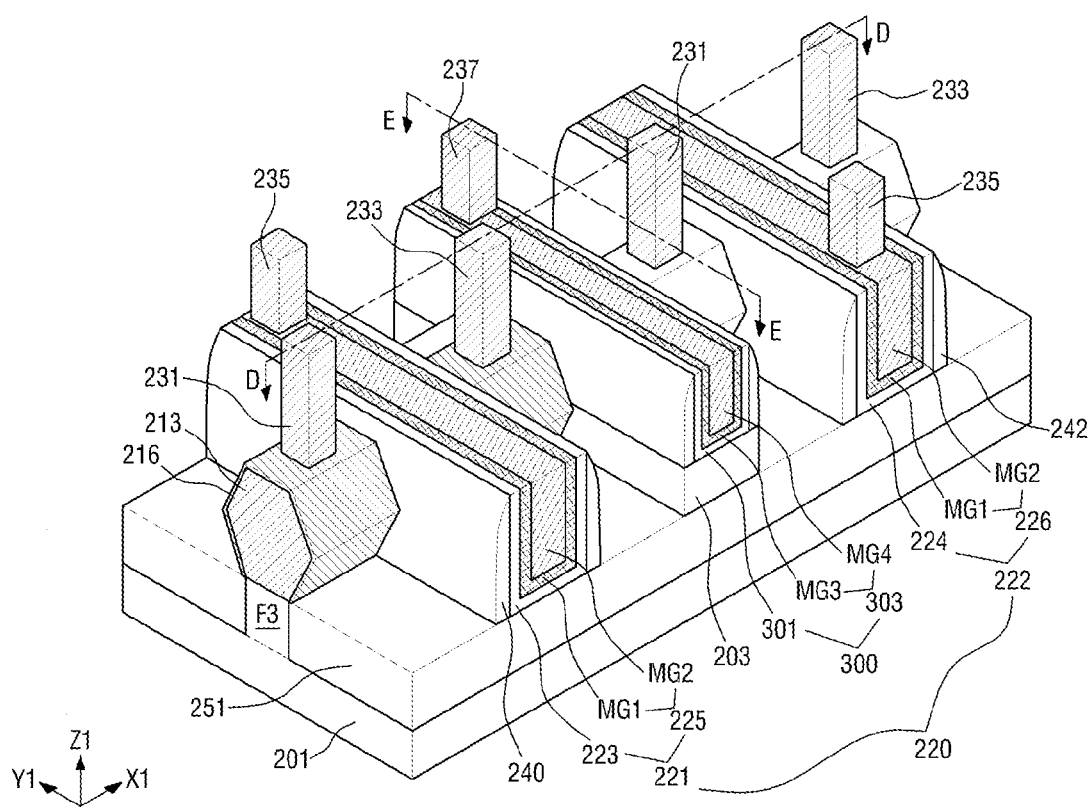
FIGS. 15 and 16 are views of portion D in FIG. 10 according to another embodiment of the present inventive concept.
Figure 16:
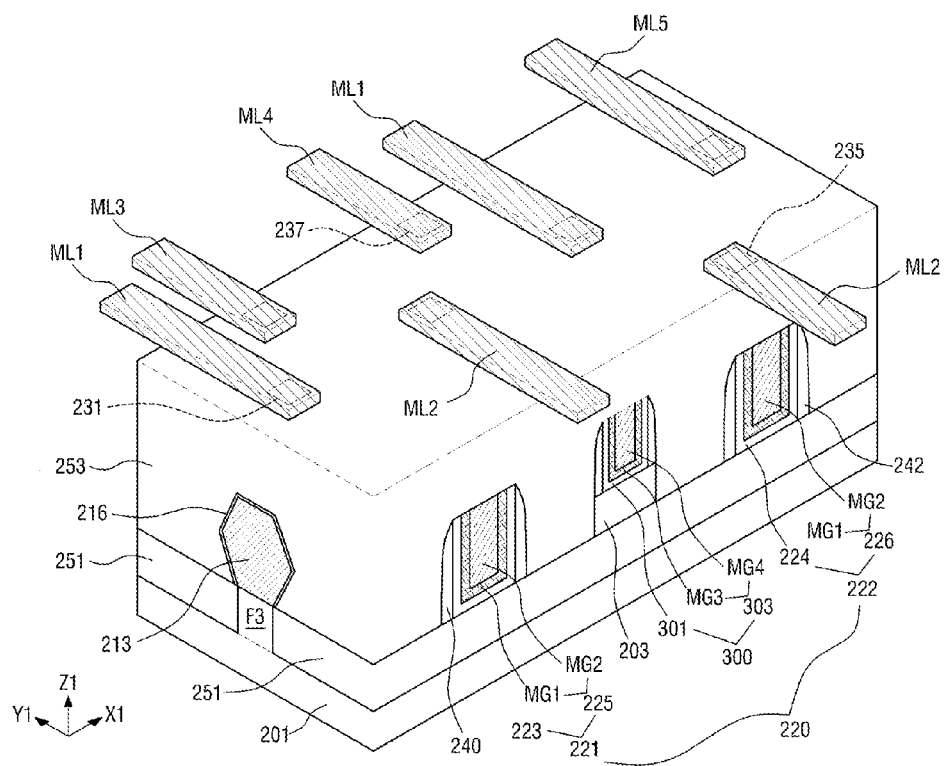

Referring to FIGS. 15 and 16, portion D in FIG. 10 according to another embodiment of the present inventive concept will be described. FIGS. 15 and 16 are views of portion D in FIG. 10 according to another embodiment of the present inventive concept. For convenience in explanation, FIG. 15 does not illustrate the interlayer insulating layer 253 and the conductive patterns ML1, ML2, ML3, ML4, and ML5. The contents duplicate to those as described above will be omitted, and explanation will be made around the different points between them.

Referring to FIGS. 15 and 16, the shapes of the silicide layers may differ from each other. Specifically, a second silicide layer 216 may be formed between the drain region 213 and the first contact 231 and between the source region 215 and the second contact 233. The second silicide layer 216 may cover the surface of the drain region 213 and the surface of the source region 215. In FIGS. 11 to 14, the first silicide layer 214 covers only the upper surfaces of the source region 215 and the drain region 213, and in FIGS. 15 and 16, the first silicide layer 214 may be formed to surround the drain region 213 and the source region 215. In the same manner as the first silicide layer 214, the second silicide layer 216 may serve to reduce the surface resistance and contact resistance of the drain region 213 and the source region 215.

The second silicide layer 216 may include a conductive material, for example, Pt, Ni, or Co.

The transistor structures and other structures described herein may have many applications. For example, such structures may be included in a memory system, such as a DRAM, NAND flash, MRAM, FRAM, RRAM, or other volatile or non-volatile memory device that uses addressing to access memory locations. The structures may also be used as part of a logic device. In addition, the structures described herein may be implemented as part of a single chip memory device, a multi-chip, stacked memory device, a packaged memory device including one or more chips stacked on a package substrate, a package-on-package device, a memory module, or other types of memory systems.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. A test pattern of a semiconductor device, the test pattern comprising:
    first and second fins protruding from a substrate and being spaced apart from each other;
    first and second gate structures crossing over the first and second fins, respectively;
    a first source region and a first drain region on the first fin on one side and the other side of the first gate structure, respectively;
    a second source region and a second drain region on the second fin on one side and the other side of the second gate structure, respectively;
    a first conductive pattern connected to the first and second drain regions to apply a first voltage to the first and second drain regions;
    a second conductive pattern connecting the first source region and the second gate structure; and
    a dummy gate structure between the first and second fins, wherein the dummy gate structure is disposed on a field insulating layer.

2. The test pattern of claim 1, wherein a second voltage that is different from the first voltage is applied to the first gate structure.

3. The test pattern of claim 1, wherein a third voltage that is different from the first voltage is applied to the second source region.

4. The test pattern of claim 3, wherein the third voltage includes a ground voltage.

5. The test pattern of claim 1, wherein a lower surface of the dummy gate structure is equal to or higher than a lower surface of each of the first and second gate structures.

6. The test pattern of claim 1, further comprising an interlayer dielectric layer on the field insulating layer.

7. The test pattern of claim 1, wherein a second voltage that is different from the first voltage is applied to the dummy gate structure.

8. A test pattern of a semiconductor device, the test pattern comprising:
    a plurality of fin-type transistors including fins protruding from a substrate and gate electrodes crossing over the fins, respectively;
    a first conductive pattern positioned to apply a first voltage to respective drain regions of the plurality of fin-type transistors;
    a second conductive pattern electrically connecting a gate electrode of a first transistor of the plurality of fin-type transistors and a source region of a second transistor of the plurality of fin-type transistors; and
    a third conductive pattern connected to a gate electrode of the second transistor to apply a second voltage different from the first voltage.

9. The test pattern of claim 8, wherein whether the plurality of fin-type transistors are inferior is determined through measurement of current that flows from the drain regions to source regions of the plurality of fin-type transistors.

10. The test pattern of claim 8, further comprising a fourth conductive pattern connected to a source region of the last transistor among the plurality of fin-type transistors to apply a ground voltage to the source region of the last transistor.

11. The test pattern of claim 8, further comprising a dummy gate electrode arranged between at least two transistors of the plurality of fin-type transistors.

12. The test pattern of claim 11, further comprising a fourth conductive pattern connected to the dummy gate electrode to apply a ground voltage to the dummy gate electrode.

13. A test pattern of a semiconductor device, the test pattern comprising:
    first through Nth fin-type transistors including first through Nth fins protruding from a substrate, respectively, wherein
    the first fin-type transistor includes a first gate structure crossing over the first fin, a first source region on the first fin on one side of the first gate structure, and a first drain region on the first fin on the other side of the first gate structure,
    the second fin-type transistor includes a second gate structure crossing over the second fin, a second source region on the second fin on one side of the second gate structure, and a second drain region on the second fin on the other side of the second gate structure,
    the (N−1)th fin-type transistor includes a (N−1)th gate structure crossing over the (N−1)th fin, a (N−1)th source region on the (N−1)th fin on one side of the (N−1)th gate structure, and a (N−1)th drain region on the (N−1)th fin on the other side of the (N−1)th gate structure, and
    the Nth fin-type transistor includes an Nth gate structure crossing over the Nth fin, an Nth source region on the Nth fin on one side of the Nth gate structure, and an Nth drain region on the Nth fin on the other side of the Nth gate structure,
    a first conductive pattern connected to the first through Nth drain regions;
    a second conductive pattern connected to the first gate structure;
    a third conductive pattern connecting the first source region and the second gate structure;

a fourth conductive pattern connecting the (N−1)th source region and the Nth gate electrode; and a fifth conductive pattern connected to the Nth source region.

14. The test pattern of claim 13, further comprising a dummy gate structure between the first gate structure and the second gate structure.

15. The test pattern of claim 14, wherein the dummy gate structure is substantially parallel to the first gate structure and the second gate structure.

16. The test pattern of claim 13, further comprising a dummy gate structure between the (N−1)th gate structure and the Nth gate structure.

17. The test pattern of claim 14, wherein the dummy gate structure is substantially parallel to the (N−1)th gate structure and the Nth gate structure.

* * * * *